United States Patent
Wells (10) Patent No.: US 7,880,151 B2
(45) Date of Patent: Feb. 1, 2011

(54) BEAM POSITIONING FOR BEAM PROCESSING

(75) Inventor: Andrew B. Wells, Portland, OR (US)

(73) Assignee: FEI Company, Hillsboro, OR (US)

( * ) Notice: Subject to any disclaimer, the term of this patent is extended or adjusted under 35 U.S.C. 154(b) by 524 days.

(21) Appl. No.: 12/039,535

(22) Filed: Feb. 28, 2008

(65) Prior Publication Data

US 2009/0218488 A1 Sep. 3, 2009

(51) Int. Cl.
G01N 23/00 (2006.01)
(52) U.S. Cl. ............ 250/492.1; 250/492.2; 250/492.21; 250/492.22; 250/492.3; 250/307
(58) Field of Classification Search .............. 250/492.1, 250/492.2, 492.21, 492.22, 492.3, 306, 307, 250/309, 311, 442.11
See application file for complete search history.

(56) References Cited

U.S. PATENT DOCUMENTS

| | | | |
|---|---|---|---|
| 5,315,123 A | | 5/1994 | Itoh et al. |
| 5,656,811 A | * | 8/1997 | Itoh et al. ................. 850/43 |
| 5,847,821 A | | 12/1998 | Tracy et al. |
| 5,942,805 A | | 8/1999 | Winer et al. |
| 6,455,862 B1 | * | 9/2002 | van der Veen et al. ..... 250/492.2 |
| 6,521,890 B2 | * | 2/2003 | Ishitani et al. ................. 850/43 |
| 6,570,170 B2 | | 5/2003 | Moore |
| 6,573,516 B2 | * | 6/2003 | Kawakami ............. 250/492.21 |
| 6,593,583 B2 | * | 7/2003 | Iwasaki .................... 250/492.1 |
| 6,681,039 B1 | | 1/2004 | Roberts et al. |
| 6,709,554 B2 | | 3/2004 | Ferranti et al. |
| 6,838,380 B2 | | 1/2005 | Bassom et al. |
| 7,045,275 B2 | | 5/2006 | Lee et al. |
| 7,160,475 B2 | | 1/2007 | Scipioni |
| 7,362,452 B2 | | 4/2008 | Faber |
| 7,625,679 B2 | * | 12/2009 | Sullivan et al. ............... 430/22 |
| 7,660,687 B1 | * | 2/2010 | De et al. ........................ 702/85 |
| 2007/0023689 A1 | * | 2/2007 | Iizuka et al. ............. 250/491.1 |

FOREIGN PATENT DOCUMENTS

WO 2008051937 5/2008

* cited by examiner

*Primary Examiner*—Bernard E Souw
*Assistant Examiner*—Michael J Logie
(74) *Attorney, Agent, or Firm*—Scheinberg & Griner, LLP; David Griner; Michael O. Scheinberg (57) ABSTRACT

An improved method and apparatus of beam processing corrects for beam drift while a beam is processing a sample. The beam position is aligned using a fiducial that is sufficiently near the working area so that the fiducial can be imaged and the sample processed without a stage moving. During processing, the beam positioning is corrected for drift using a model that predicts the drift.

32 Claims, 7 Drawing Sheets

BEAM POSITIONING FOR BEAM PROCESSING

TECHNICAL FIELD OF THE INVENTION

The present invention relates to a method of accurately positioning a beam, such as an electron beam, ion beam or laser beam, for performing beam processing to create or modify microscopic structures.

BACKGROUND OF THE INVENTION

Charged particle beams, laser beams, and neutral particle beams are used in a variety of microfabrication applications, such as fabrication of semiconductor circuitry and microelectromechanical assemblies. The term "microfabrication" is used to include creating and altering structures having dimensions of tens of microns or less, including nanofabrication processes. "Processing" a sample refers to the microfabrication of structures on that sample. As smaller and smaller structures are fabricated, it is necessary to direct the beam more precisely. It has been found, however, that the impact point of a beam on a sample tends to drift over time. That is, when the operator instructs the system to position the beam at point P1, the beam actually ends up at position P2 a short time later. The difference between the coordinates of the points P1 and P2 is referred to as the beam drift. The drift can be caused by mechanical or thermal instabilities that cause slight movement of the stage on which the sample is positioned or of the elements that generate and focus the beam. While the drift is small, it becomes more significant as smaller structures are fabricated.

One method of accurately positioning a beam is to mill a fiducial, that is, a reference mark, and position the beam relative to the fiducial. The term fiducial is used broadly to include any type of reference mark. A beam is initially directed to image a fiducial and an initial offset to the desired location is determined. Subsequently, the beam is periodically directed to image the fiducial and the positioning of the beam to the desired location is corrected by determining an offset between the observed coordinates of the fiducial and the original coordinates of the fiducial. The offsets are then added to the beam positioning instructions so that the beam ends up at the desired location. Repeated scanning of a fiducial with an ion beam, however, degrades the fiducial, making it less useful for precise positioning. Thus there is a need for a system which periodically scans a fiducial with a beam which does not damage the fiducial, while also using a beam to do microfabrication at a desired location.

One aspect of semiconductor manufacturing that requires accurate beam positioning is the extraction of thin samples for transmission electron microscopy. Such samples are used for monitoring the semiconductor fabrication process. A thin, vertical sample, referred to as a lamella, is extracted to provide a vertical cross section of the structure.

A transmission electron microscope (TEM) allows an observer to image extremely small features, on the order of nanometers or smaller. In a TEM, a broad beam impacts the sample and electrons that are transmitted through the sample are focused to form an image of the sample.

In a scanning transmission electron microscope (STEM), a primary electron beam is focused to a fine spot, and the spot is scanned across the sample surface. Electrons that are transmitted through the sample are collected by an electron detector on the far side of the sample, and the intensity of each point on the image corresponds to the number of electrons collected as the primary beam impacts a corresponding point on the surface. This technique can allow an observer to image features of sizes below one nanometer.

For both TEM and STEM, beam positioning while preparing the thin sample is important, because the beam must not etch away the feature of interest, yet the sample must be sufficiently thin to allow many of the electrons in the primary beam to travel though the sample and exit on the opposite site. Samples are typically less than 100 nm thick.

One technique to cut a sample from a substrate or bulk sample without destroying or damaging surrounding parts of the substrate is referred to as a "lift-out" technique. A focused ion beam (FIB) is typically used to free the sample. A lift-out technique is useful in analyzing the results of processes used in the fabrication of integrated circuits, as well as analyzing materials in the physical or biological sciences.

Figure 1:
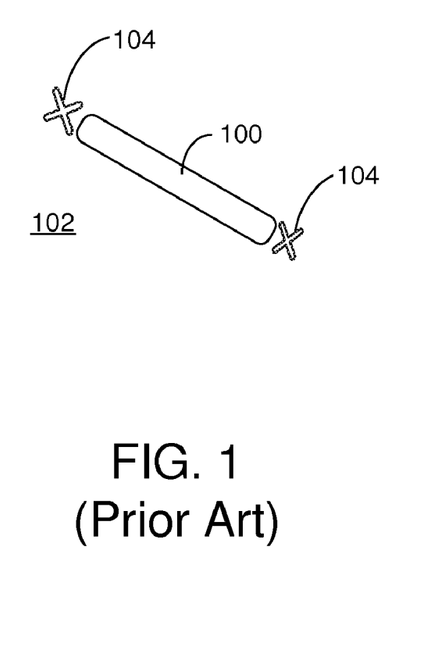
FIG. 1 shows the first steps of a prior art method of extracting a lamella.
Figure 2:
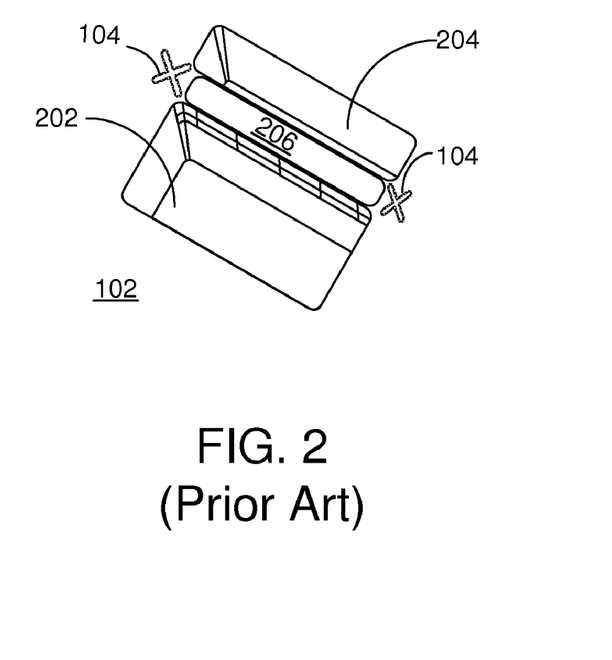
FIG. 2 shows trenches milled on either side of the region of interest.
Figure 3:
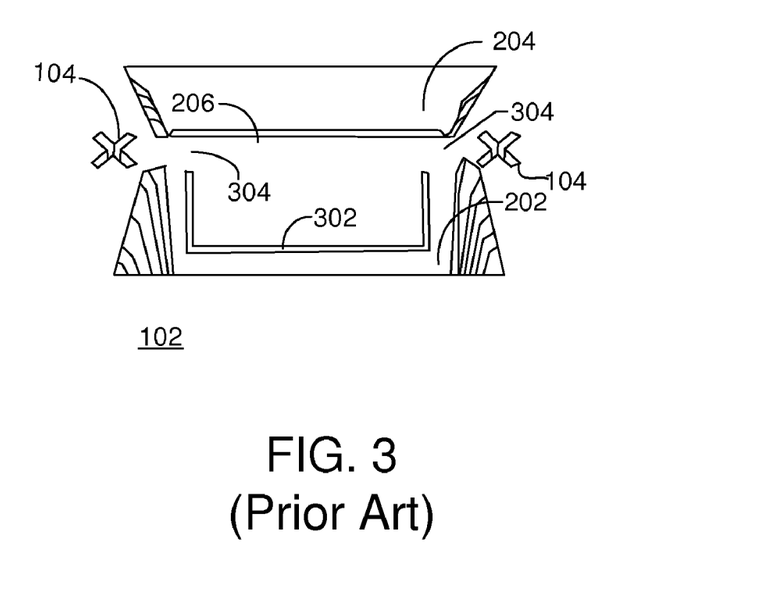
FIG. 3 shows the lamella supported only by tabs.

FIGS. 1-3 illustrate a commonly used sample preparation technique. A protective layer 100 of a material such as tungsten is deposited over the area of interest on a sample surface 102 using electron beam or ion beam assisted deposition. Fiducials 104 are milled near the region of interest to serve as reference markers for aligning the focused ion beam that will be used to cut the sample. Next, as shown in FIG. 2, a focused ion beam using a high beam current with a correspondingly large beam size is used to mill rectangles 202 and 204, respectively in front of and behind the region of interest, leaving a thin vertical sample section, lamella 206, that includes a vertical cross section of the area of interest.

As shown in FIG. 3, once the specimen reaches the desired thickness, the stage is tilted and a U-shaped cut 302 is made at an angle partially along the perimeter of the lamella 206, leaving the lamella hanging by tabs 304 at either side at the top of the sample. The sample section is then further thinned using progressively finer beam sizes. Finally, a probe (not shown) is attached to the lamella 206 and the tabs 304 are cut to completely free the thinned lamella 206.

Because of the precision required for each operation, it is necessary that the beam be placed accurately for each cut, particularly for the final thinning operation. This can be a problem because the beam position tends to drift over time as described above. One solution is to remove most of the material required to extract the sample and then to correct for drift by imaging a fiducial just before a final cut is made. Although the time required to make the final cut is not as long as the time required to make the first cut, the beam still drifts while making the final cut, reducing the milling accuracy.

U.S. Pat. No. 6,521,890 for "Focused Ion Beam Machining Method and Focused Ion Beam Machining Apparatus" to Ishitani et al. teaches using secondary ion microscopy to form images of a fiducial in the field of the view of the ion beam at prescheduled intervals and then to adjust the ion beam based on comparing each image to the previous image. Ishitani et al. explains that use of the previous image for comparison compensates for change in shape of the fiducial caused by the ion beam. As the fiducial degrades, however, it becomes a less precise reference.

U.S. Pat. No. 5,315,123 for "Electron Beam Lithography Apparatus" to Itoh et al. teaches correction of electron beam drift in electron beam lithography. The drift of an electron beam during the lithography writing process is determined by measuring a reference mark on the stage and the position of the beam is corrected for the beam drift while the beam is blanked as the stage is moved between circuit patterns. The described technique uses a single reference mark for multiple circuit patterns and the stage moves between corrections, which can introduce errors into the positioning. The technique is also limited to imaging fiducials outside the area being processed by the electron beam.

SUMMARY OF THE INVENTION

The invention provides a method and apparatus for correcting beam drift in charged particle beam systems.

Embodiments of the invention predict drift in a beam position and use the predicted drift to correct the beam positioning. The beam position is preferably first aligned by imaging a fiducial that is located sufficiently close to the feature being processed so that the stage need not be moved between a step of imaging the fiducial and a step of processing the feature. After the beam is aligned, the beam processes the sample, and the beam drift is corrected while the beam is processing the sample.

The drift may be determined using a mathematical drift model in which the drift is characterized by an equation or a table, preferably determined from prior measurements of the position of the fiducial over a period of time. Using the model, periodic re-imaging of the fiducial allows drift to be predicted and corrected continuously over time.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable.

A beam controller directs a beam to specified coordinates using a beam controller coordinate system in response to a stored program or operator instructions. Because of misalignment and drift, the beam controller coordinate system does not correspond exactly to a sample coordinate system fixed with respect to the sample surface. Imaging a fiducial allows the controller to determine coordinate offsets to bring the beam controller coordinate system back into alignment with the sample coordinate system. During processing, however, the coordinate systems drift apart and become misaligned. In accordance with one aspect of the invention, this drift is modeled and the controller coordinates are modified during processing, so that when the beam controller directs the beam to a particular point specified in the beam controller coordinate system, the beam impact point on the sample surface more closely approximates the desired point.

In one preferred embodiment, a charged particle beam is positioned accurately for processing a sample by first aligning the beam using a fiducial that is sufficiently near the area being processed so that no stage movement is required between aligning and processing. This proximity eliminates positional inaccuracies and instabilities associated with stage movement and eliminates the need to change the magnification.

While the beam is processing the sample after being aligned, the coordinates of the beam are corrected from the last aligned value based on a predicted drift. Imaging the fiducial to determine coordinate offsets is referred to as an "alignment" and altering the coordinates based on a beam drift model is referred to as a "correction." Correction "while processing" is meant that the beam is corrected without shifting the beam to re-image the fiducial. It will be understood that beam processing typically includes periods of time when the beam is directed toward the surface in a raster, serpentine, or arbitrary pattern, and periods of time when the beam is not actually impacting the surface, such as when the beam is blanked to move from the bottom of a raster pattern to the top.

Imaging the fiducial for alignment can be performed by the same beam that is processing the sample or by using a different beam or imaging system. For example, in a dual beam system having an ion beam and an electron beam, the FIB can be used to process the sample, and a fiducial may be imaged by the scanning electron microscope or an optical microscope, thereby reducing damage to the fiducial from repeated FIB imaging. In many systems, the drift due to stage movement is greater than the drift caused by instabilities in the beam-generating column, so therefore relative motions between the two beams or microscopes can be disregarded. An alignment can be performed while processing by having one beam image the fiducial at the same time that another beam processes the sample. Alternatively, processing can pause while an alignment is performed with either beam, and then processing can resume.

To predict and correct the beam drift during beam processing, the drift is first characterized and modeled as a mathematical expression or a data table. The term "beam drift" as used herein refers to unintended changes over time of the beam position, regardless of the source. The characterization is typically performed by repeated measurements of a known point over a period of time as described in more detail below. Once the beam drift is characterized, the beam coordinates can be corrected by the beam controller, periodically or continuously, so that the beam is always directed to the desired position on the sample within a predetermined tolerance. Whether the beam position is corrected periodically or continuously depends upon the accuracy required.

Because the actual beam drift depends on the operating conditions in the instrument, the projected drift may not be adequate to reposition the beam with sufficient accuracy over an extended period of time. In such cases, the beam may be periodically realigned by imaging the fiducial and calculating new beam position offsets from the fiducial location. The drift model can then be more accurately fit to the actual measured drift, correcting for drift between the periodic determinations of the actual coordinate offset.

Some embodiments of the invention are especially useful in creating lamellae to observe on a TEM. Thus, lamella creation incorporating aspects of the invention is described herein in detail. However, the invention is not limited to use in lamella creation. Embodiments are useful in any precision charged particle or laser beam process, such as cutting, etching, drilling, imaging, and depositing on any substrate for any purpose.

To extract a TEM lamella using a FIB, an operator typically first locates a feature or site of interest. Because FIB imaging inevitably causes some sample damage, a protective layer is deposited over the desired lamella location before imaging and/or milling. The protective layer makes it harder to see features on the substrate so a fiducial mark is typically milled into the protective layer to help orient the beam and locate the proper place for a cut. Image recognition keyed to this fiducial can be used to find the locations for subsequent milling of the lamella.

Figure 4:
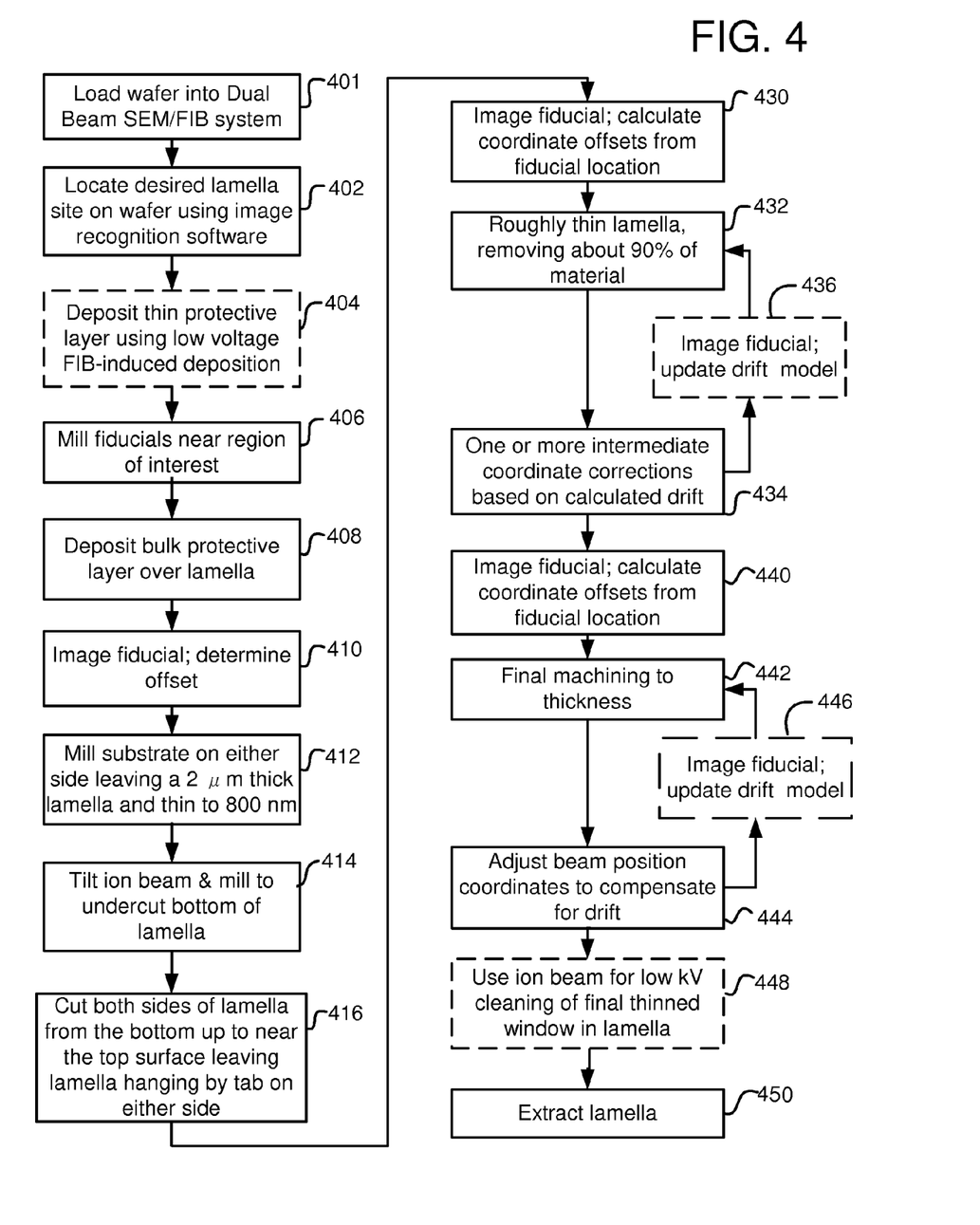
FIG. 4 is a flowchart showing the steps of creating one or more lamellae using a preferred embodiment of the present invention for accurate beam positioning.

FIG. 4 is a flowchart showing an improved method of producing a lamella. Machine-vision based metrology and image recognition, high-precision fiducial marks, automatic fiducial placement, and drift correction are preferably used to significantly improve lamella placement accuracy and precision. The lamella extraction method is described, without the drift correction described herein, in more detail in PCT App. No. PCT/US07/82030, filed on Oct. 20, 2007, which is hereby incorporated by reference.

First, in step 401, a wafer is loaded into a SEM/FIB system, such as a Certus Dual Beam System, commercially available from FEI Company of Hillsboro, Oreg., the assignee of the present invention. In step 402, lamella sites on the wafer surface are located preferably automatically using image recognition software. Suitable image recognition software is available, for example, from Cognex Corporation of Natick, Mass. Image recognition software can be "trained" to locate the desired lamella locations by using sample images of similar features or by using geometric information from CAD data. Automated FIB or SEM metrology can also be used to identify or help identify the lamella site. Metrology may consist of image-based pattern recognition, edge finding, automated defect redetection (ADR), center-of-mass calculations, blobs, etc.

Figure 5:
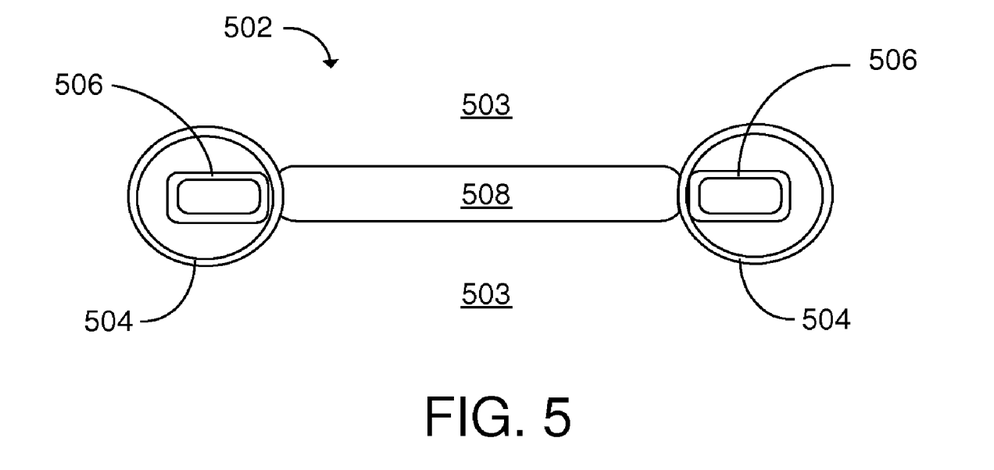
FIG. 5 shows a lamella site with fiducials milled and a protective layer applied.

In optional step 404, a thin protective tungsten coating is deposited over the lamella region using low voltage FIB-induced deposition to prevent damage during subsequent FIB processing. In step 406, a combination of low-precision fiducials and higher precision fiducials are milled. High-precision fiducials, such as the rectangles 506 shown in FIG. 5, are milled at either end of the desired lamella location and allow the lamella location to be much more accurately determined. In a preferred embodiment, a suitable fiducial pattern will allow the final lamella placement to be accurate within 10 nm. The size and shape of the fiducial can be varied depending on the size, width, or location of the desired lamella.

In step 408, after the high precision fiducials have been milled, a bulk protective layer 508 composed of, for example, tungsten or platinum is deposited over the lamella site to protect the sample from damage during the milling process. FIG. 5 shows a lamella site 502 with a protective layer 508 deposited over the desired lamella location on a wafer surface 503. The high precision fiducials 506 are also preferably lightly backfilled with the protective material to protect them during future processing.

In step 410, the ion beam or the electron beam images the fiducial and a coordinate offset is determined based on the measured coordinates of the fiducial compared to the actual coordinates of the fiducial known from previous imaging or from the fiducial milling step. By applying the coordinate offset to the beam position, the beam is more accurately placed when milling, depositing, imaging or performing any other beam process. Imaging the fiducial with the electron beam reduces damage to the fiducial and can be used to determine coordinate offsets for the ion beam if the relative positions of the electron beam and ion beam are sufficiently stable.

Figure 6:
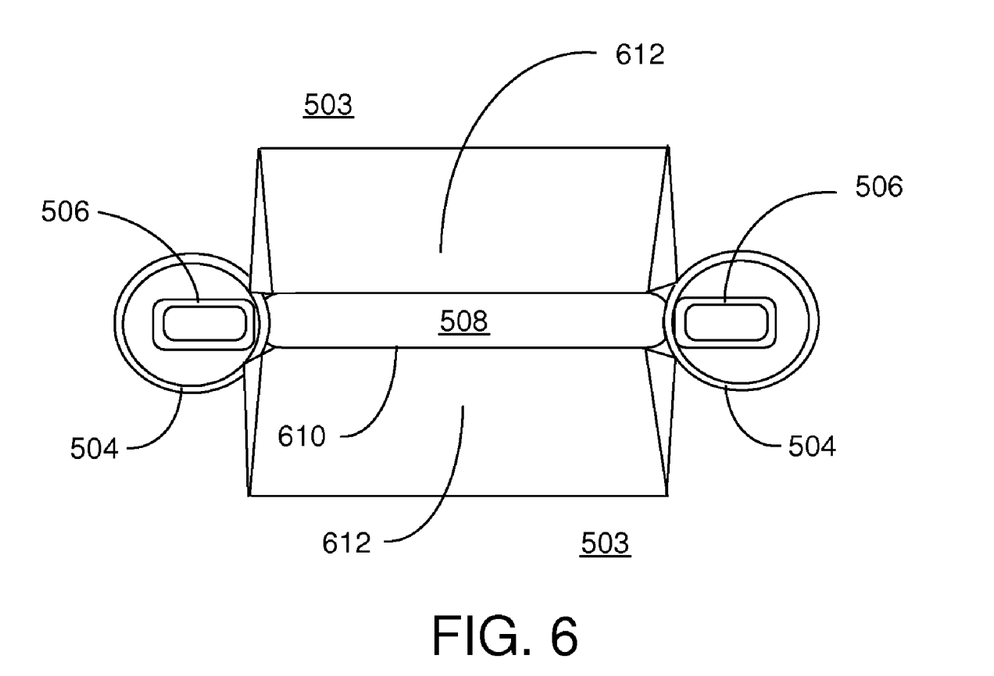
FIG. 6 shows the lamella site of FIG. 5 with trenches milled on either side of a lamella.

In step 412, the FIB system navigates to the lamella site and begins to mill out the lamella as shown in FIG. 6. A larger ion beam with higher beam current is suitable for bulk material removal. The lamella is preferably formed by using a FIB to cut two adjacent rectangles 612 on a substrate, the remaining material between the two rectangles forming a thin vertical wafer, lamella 610, that includes an area of interest. A typical cross-section mill pattern can be used coming in from both sides of the lamella, leaving a coarse lamella approximately 2 μm thick. While drift correction can be applied during step 412, the rough nature of the cut typically makes the improved accuracy provided by drift correction unnecessary. The lamella is then further thinned to approximately 800 nm with a cleaning cross-section mill on both sides in preparation for the undercut step.

Figure 7:
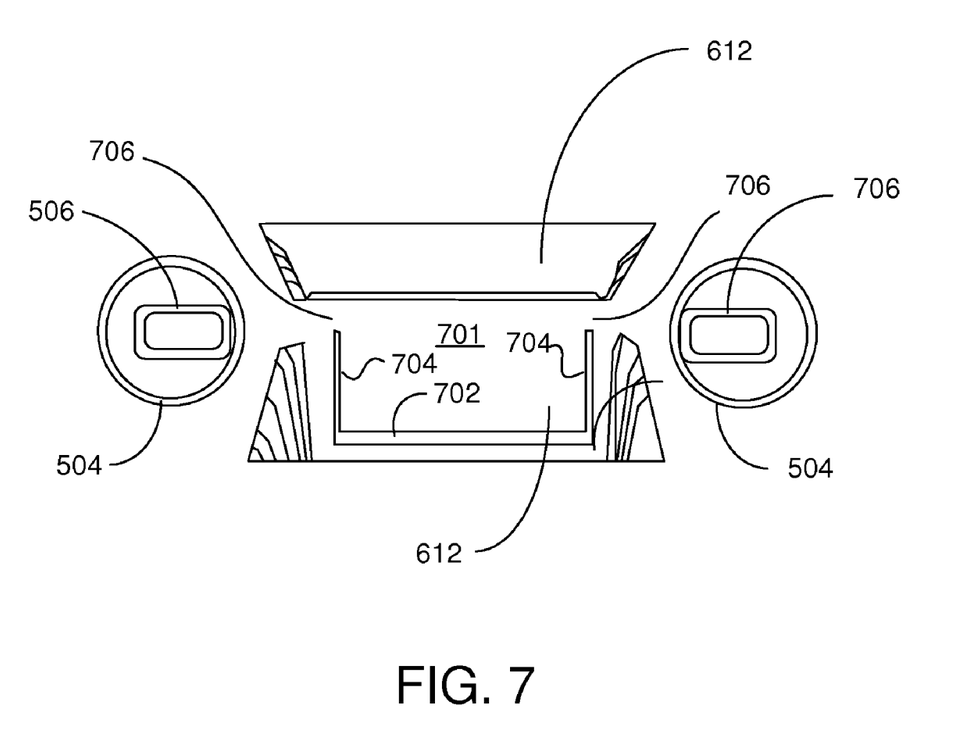
FIG. 7 shows a lamella ready to be extracted.

In step 414, the lamella is milled as shown in FIG. 7 to form an undercut 702 for a lamella sample 701, and in step 416 the ion beam makes side cuts 704, leaving the lamella hanging by a tab 706 on either side at the top of lamella.

In step 430, the beam is moved to image the fiducial and new coordinates offsets are determined. In step 432, the lamella is thinned from both sides. During the thinning, the coordinates of the beam are corrected in step 434 based on a predicted beam coordinate drift. The beam correction of step 434 can be repeated in multiple steps during the thinning process or the correction can be applied continuously based on the predicted drift characteristics, without having to re-image the fiducial. The determination of the drift model is described in more detail below. Of course, the fiducial can be re-imaged whenever necessary during processing to update the coordinate offsets as shown in step 436. Thinning of the lamella may require a rotation or tilt of the sample. In such a case, the fiducial is re-imaged at least once and processing continues using a re-calculated predicted drift.

When the lamella is mostly thinned, for example when thinning is ninety percent complete, the beam is positioned again on the fiducial for a coordinate offset determination in step 440. The beam is then returned to the lamella for final machining to the desired thickness in step 442. While lamella is being milled to final thickness, the beam position coordinates are preferably corrected again in step 444 using the predicted drift without requiring the beam to be repositioned at the fiducial. Again, the fiducial can be re-imaged in step 446 whenever necessary to update the coordinate offsets.

In an alternative embodiment, there is no distinction between a rough cut and the final cut; the full pattern is cut with optional periodic re-imaging at one or more intermediate times during the process. At these one or more times, the offset is determined, an updated predicted drift is calculated, and cutting continues. While the cutting continues, the drift value is continually or periodically re-calculated and the offset value is continually re-updated. In some processes, there may not be any re-imaging of the fiducial during processing, and after an initial alignment, the beam position is corrected based on the drift prediction until the process is complete.

In optional step 448, low-kV cleaning is performed on the final thinned window with a 180 pA 5 kV FIB at 4.5 degrees of tilt. A ten second cleaning mill on each face of the lamella produces a significant improvement in TEM imaging conditions. Milling is preferably performed using the milling pattern described in PCT Application No. PCT/US07/82163 to prevent bowing of the thin lamella. Once the final thinning of the lamella has been completed, the lamella is extracted from the sample in step 450 by attaching a probe to the lamella and severing the tabs or hinges, either with the ion beam or physically with the probe.

In a preferred embodiment, the beam drift is modeled as a parametric function of time. The function may include linear and exponential terms having coefficients determined by a best fit to a set of measurements of a fiducial position made at two or more different times.

Over the time scale involved in lamella preparation, the drift rate can, for example, be modeled as an exponentially decreasing function of time. The position of the beam relative to the sample can be modeled as an equation of the form:

$$x(t)=(a-c)*\exp(-b*t)+c,$$

where x(t) is the position of the beam relative to the sample expressed as a function of time, t, and where a is the position of the beam at time t=0, b relates to the rate at which the position changes, and c is the asymptotic value of the position which is approached after a long time. The position x can refer to measured position in any chosen direction, and multiple equations of this form can be used to describe drift in different orthogonal directions, as is known to those of ordinary skill in the art.

The drift distance can be predicted using a number of different methods. The drift rate can be determined before starting the beam processing, or can be determined from the initial and intermediate alignments performed during a beam operation, such as cutting a lamella. The drift equation given above has three unknown variables describing initial position, drift rate, and asymptotic position. It is thus necessary to have position data at exactly three distinct times in order to perfectly fit this form of curve to the data. For instances in which only one intermediate alignment is performed, position data is available for only two distinct times. However, an average drift rate parameter (b in the equation above) can be determined through prior experimentation. With this drift rate assumed, the parameters a and c can be derived using only two data points.

If position data is known at exactly three distinct times, a curve of the form above can be perfectly fit to the data. However, there is some amount of statistical imprecision in the three data points due to measurement inaccuracies. Additionally, the equation might not precisely match the actual drift behavior. Therefore, more position data, taken at other times, can be used to better refine the drift prediction.

When more than three position vs. time data sets are collected, the three parameters of the drift equation described above can be best estimated using a nonlinear least squares fit. The techniques for performing this fit are known to those with ordinary skill in the art. Those skilled in the art can also perceive that equations with multiple decreasing exponentials, equations with terms that are linear in time, and other forms could all describe a position drift in an equally good or better manner.

Figure 8:
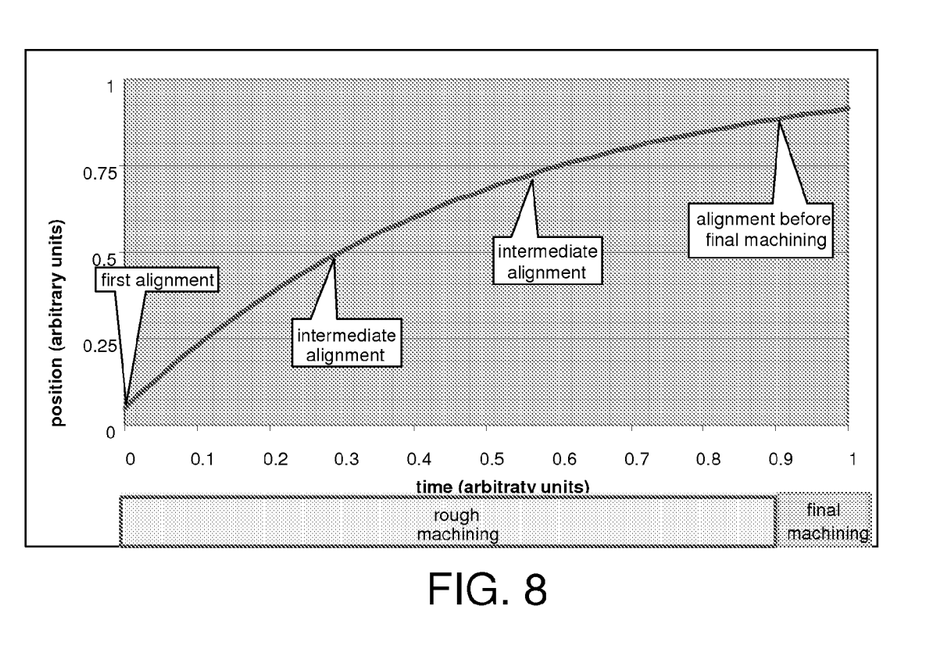
FIG. 8 is a graph of position versus time, showing drift and periodic realignment.

The function that most accurately describes the drift may be determined by relatively simple experimentation. Algorithms other than exponential functions can be employed in the calculation of predicted drift over time. Thus, any experimentally determined curve or table that accurately predicts drift can be used. FIG. 8 shows an example of a beam-to-sample position versus time graph. The graph is an exponential decay in offset versus time, asymptotically converging toward a steady-state value.

FIG. 8 shows that before the first cut, an alignment is made by imaging the fiducial and determining the offset to make the cut. Thus, as the cut is being made, a correction is computed from the alignment and the predicted drift and the beam position is corrected according to the computed offset. Occasionally, preferably at least once, an intermediate alignment is made by imaging the fiducial and determining a corrected offset. At this time, a correction in the predicted drift curve is made if needed.

Thus, a first alignment is performed and then an intermediate alignment is performed. Between these intermediate alignments rough machining with a beam is performed while most of the drift occurs. After the intermediate alignment, an alignment before final machining is preferably performed. The predicted drift can then be used to modify the beam controller coordinates in order to machine the sample more accurately. The larger the number of alignments—or equivalently the more frequently the alignments take place—the better the estimate of the drift and the smaller the uncorrected drift error. Furthermore, since the drift rate is typically larger at the start of machining (immediately after a stage move), periodic realignment will help to improve the accuracy of the machining done in the first portion of the process as well. As described above, in some embodiments, the alignment can be performed with one beam while processing with a second beam. Other embodiments use the same beam for imaging the fiducial and for processing the sample. These latter embodiments suffer the disadvantage that the fiducial may be substantially eroded by the beam. But in some cases, at least, this disadvantage may be overcome by good pattern recognition to more precisely determine position from the fiducial. Note that imaging and processing could, in some embodiments, be performed simultaneously, while in some embodiments imaging and processing are not done simultaneously.

The invention is also useful in obtaining very high-resolution images. In an application in which it takes a significant time to obtain an image and the beam could drift while the image is being obtained, embodiments of the invention can reduce the effects of beam drift over the course of a single or multiple beam scans over the field. For example, the invention would be useful in forming an elemental map of a sample using secondary ion mass spectroscopy. In secondary ion mass spectroscopy (SIMS), it may require significant time for the ion beam to generate sufficient secondary ions of an element present at low concentrations. The invention could be applied to reduce beam drift during the acquisition of the SIMS image. The imaging beam can be corrected for drift while it is forming the SIMS image.

As another example, a method of imaging a feature in a sample could include locating a fiducial in close proximity to the location of the feature to be imaged so that a stage holding the sample need not be moved between a fiducial-imaging step and a feature-imaging step. The fiducial is then imaged with a first imaging beam to determine the position of the fiducial to use as an alignment marker for fine imaging. An offset is determined to direct a second imaging beam to form an image of the feature. While imaging the feature, a predicted drift is determined and corresponding offset values are updated to more accurately maintain the second imaging beam in the appropriate position to form the image. During image creation, the fiducial is re-imaged as necessary with the first imaging beam in order to determine an updated offset to maintain the second beam in the correct position for imaging. The first and second imaging beams can be the same beam or different beams.

Figure 9:
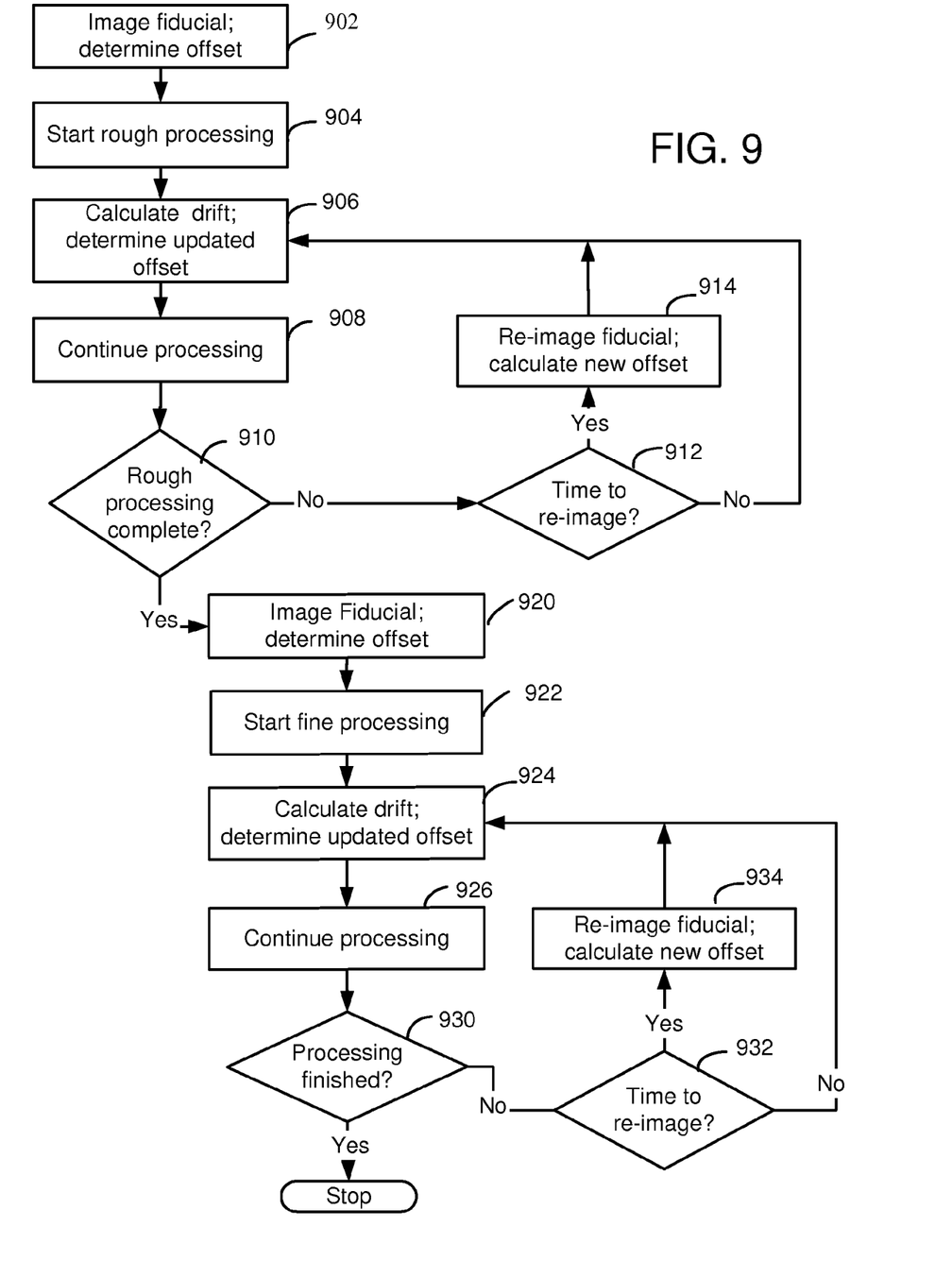
FIG. 9 is a flow chart showing drift correction while processing a sample.

FIG. 9 shows a flow chart of an embodiment for processing a sample with a beam using drift prediction and alignment updates. The processing can include, for example, cutting, deposition, or imaging using, for example, a charged particle beam, laser beam, cluster beam, or neutral beam. While the steps are described as being performed by an operator, some or all of the steps can be automated to be controlled by a computer without human intervention. In step 902, an operator images the fiducial and determines the offset for the start of the process. The fiducial and the feature to be processed are preferably in the same field of view. Next, rough processing begins in step 904. During processing, the predicted beam drift is calculated in step 906 as described above, preferably using an exponential function of time. The beam position is periodically updated to compensate for the calculated drift.

Having determined an updated corrected offset, processing continues in step 908 using the corrected value. Unless it is determined in decision block 910 that rough processing is completed, a decision is made in step 912 as to whether it is necessary to re-image the fiducial. The re-imaging of the fiducial is preferably performed at one or more intermediate times that may be pre-determined by the system operator or may be otherwise pre-programmed. For example, a computer may be programmed to position the beam to re-acquire and re-image the fiducial whenever a predetermined amount of time has lapsed since the last alignment or every time the amount of predicted drift exceeds a threshold value or a specified amount of time has passed. If it is determined in step 912 that a new alignment is required, then the fiducial is re-imaged in step 914 and then processing continues in step 906 with updated drift correction as the processing continues. If it is determined in step 912 that a new alignment is not required, then new offsets are determined based on the calculated drift, and processing continues in step 908.

When it is determined in decision block 910 that the rough processing is finished, a new image of the fiducial is obtained and a new offset determined in step 920, and the fine processing is started in step 922. During the fine processing, drift is calculated continuously or periodically and updated offsets are determined in step 924. If it is determined in decision block 930 that processing is not yet complete, the system checks in decision block 932 to determine whether it is time to re-image the fiducial and determine new offsets. If a new alignment is required, the fiducial is re-imaged in step 934 and then processing continues in step 924 with ongoing drift correction. If a new alignment is not required, then new offsets are determined based on the calculated drift in step 924, and processing continues until it is determined in decision block 930 that processing is complete. In some embodiments, no distinction is made between rough and fine processing, and the processing is completed with step 910.

Figure 10:
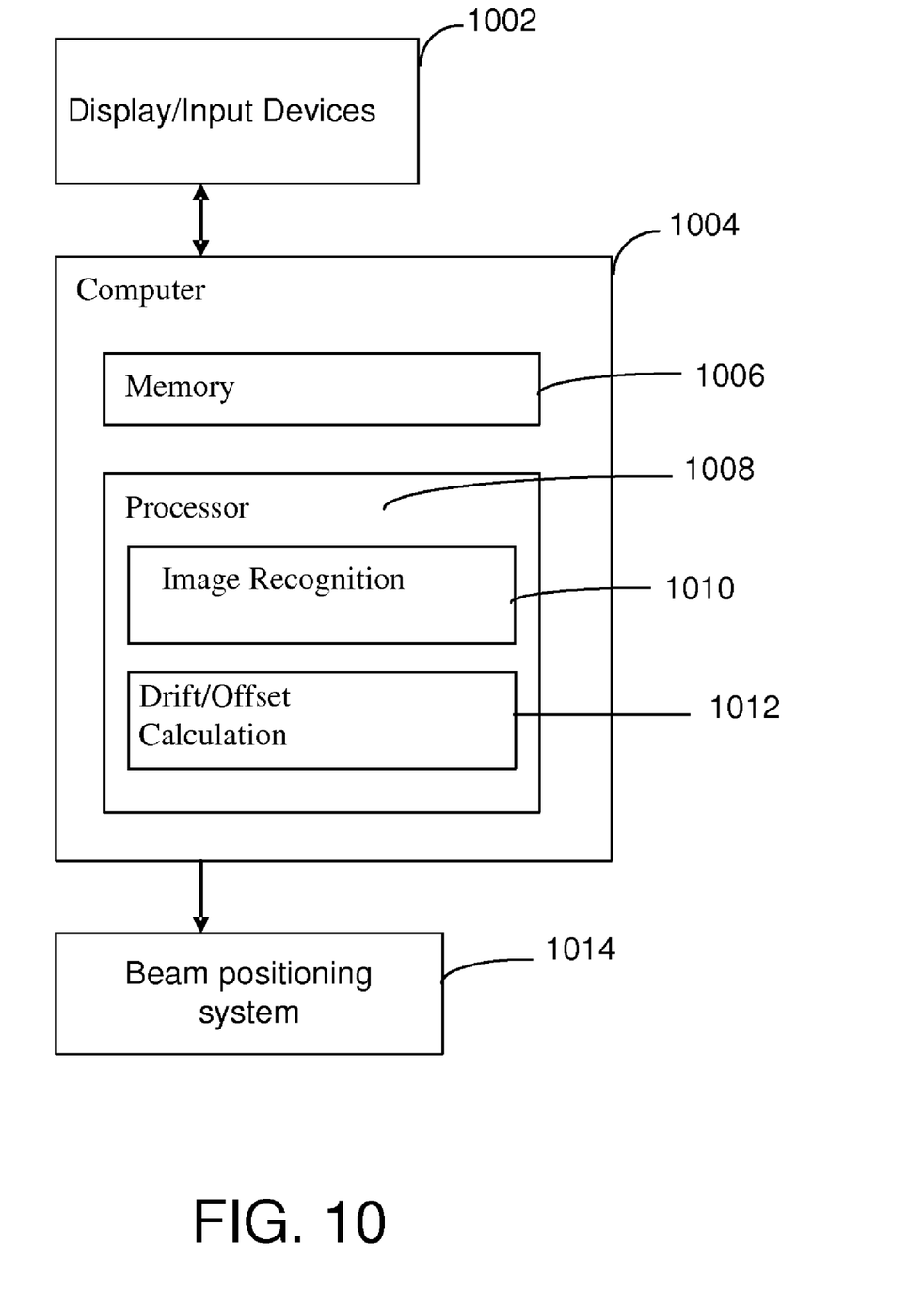
FIG. 10 is a preferred computing system for implementing methods described herein.

FIG. 10 shows a computer system for implementing the methods described herein. The computer system enables a user to control the process of imaging a fiducial and cutting a lamella. The computer system comprises a user interface 1002 comprising a display, an input device, as well as a computer 1004, and a beam positioning system 1014. Computer 1004 comprises memory 1006 to store data and computer instructions. A processor 1008 of computer 1004 executes instructions to perform pattern recognition 1010 and to calculate drift and offset 1012. Computer 1004 determines from its calculations a beam position signal and transmits this signal to beam positioning system 1014 which controls beam position.

Persons skilled in the art may readily discern other applications for the methods described above. For example, the methods may be used for deep feature drilling, where periodic re-alignments make a hole straighter and narrower. The fabrication of thin film heads used to read and write information to magnetic disks, such as computer hard disks, requires accurate beam placement that can benefit from drift compensation. Parts of the thin film heads can be damaged by the beam, and so it is necessary to accurately place the beam without repeatedly scanning the beam over the delicate area. A technique for fabricating thin-film magnetic recording heads is described in U.S. Pat. No. 7,045,275 to Lee et al. for "Thin-Film Magnetic Recording Head Manufacture," which is assigned to the assignee of the present invention. Lee et al. uses a reference marker element having a fixed spatial relationship to a structural element to be milled. The reference element is located, and then the beam is moved relative to the reference element to position the beam to mill the first structural element. Beam drift while milling the structural element reduces the accuracy of the milling. The methods described above may help to improve the milling accuracy.

Charged particle beam deposition processes can also benefit from the improved beam placement of this invention. For example, U.S. Pat. No. 6,838,380, "Fabrication of High Resistivity Structure Using Focused Ion Beams," which teaches the use of a precursor to deposit a high resistivity structure, can incorporate drift correction. The invention can also be applied to electron beam processing and imaging using a scanning electron microscope, neutral atom beams, and other beams. The term "sample" as used herein refers to any type of work piece to which a beam is directed.

Other applications that can benefit from improved beam drift compensation include the repair of photolithography masks and circuit edit, that is, altering microscopic circuits to create or sever connections. The method described herein may be used in other machining or deposition processes where accuracy is important, using SEM, FIB, laser, or other machining methods. The method may be used in imaging systems subject to large amounts of noise and requiring long image acquisition times, resulting in improved image quality.

The embodiments will vary greatly depending upon the specific application, and not every embodiment will provide all of the benefits and meet all of the objectives that are achievable by the invention.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

I claim:

1. A method of processing a microscopic structure on a sample in a beam system by using a beam controller to direct a beam to a series of beam controller coordinates in a beam controller coordinate system in order to cause the beam to move along the surface of the sample to a series of predetermined points defined in a sample coordinate system, the beam controller coordinate system varying from the sample coordinate system because of positional drift of the beam relative to the sample, the method comprising:

determining a desired beam path over the sample for processing the structure;

determining a drift model for the beam system by repeated measurements of a reference mark over a period of time to determine an offset between the beam controller coordinate system and the location of the reference mark;

aligning a beam coordinate system with a sample coordinate system for a sample loaded into the system by imaging a reference mark on the sample surface and determining an offset between the beam controller coordinate system and the sample coordinate system;

correcting the beam controller coordinates using the offset;

directing the beam to specified beam controller coordinates to cause the beam to process the sample; and using the drift model determined previously, determining a predicted offset for each beam coordinate and applying that offset to each of the beam controller coordinates as the beam is moved over the sample.

2. The method of claim 1 in which the beam is a focused ion beam, a focused electron beam, laser beam, or a neutral particle beam.

3. The method of claim 1 in which determining a drift model for the beam system includes modeling the drift rate as an exponentially decreasing function of time.

4. The method of claim 3, wherein modeling the drift rate as an exponentially decreasing function of time includes modeling the position of the beam relative to the sample according to the formula $$x(t)=(a-c)*\exp(-b*t)+c$$

where x(t) is the position of the beam relative to the sample, x, expressed as a function of time, t, where a is the position of the beam at time t=0, where b relates to the rate at which the position changes, and where c is the asymptotic value of the position.

5. The method of claim 1 in which aligning a beam coordinate system with a sample coordinate system by observing a reference mark on the sample surface includes aligning the beam coordinate system of a first beam with the sample coordinate system by observing a reference mark with a second beam, determining the offset between the beam coordinate system of the second beam and the sample coordinate system, and applying that offset to the beam coordinate system of the first beam.

6. The method of claim 1 in which aligning a beam coordinate system with a sample coordinate system for a sample loaded into the system by observing a reference mark on the sample surface includes aligning an ion beam by observing the reference mark using the ion beam.

7. The method of claim 1 in which directing the beam to specified beam controller coordinates to cause the beam to process the sample includes directing the beam to specified beam controller coordinates to cause the beam to remove material from the sample, to deposit material onto the sample, or to form an image of the sample.

8. A method of charged particle beam processing of a sample on a stage, comprising:

directing an imaging charged particle beam toward a fiducial;

determining a drift model for the beam system based upon the repeated determinations of the difference between observed coordinates of the fiducial and expected coordinates of the fiducial;

without moving the stage after the step of directing the imaging charged particle beam toward the fiducial, directing a processing beam toward a sample for charged particle beam processing, the processing beam being positioned using processing beam coordinates corrected by the coordinate offset; and while processing the sample using the processing beam, and without the processing beam being directed to image the fiducial, continuously adjusting the processing beam coordinates to compensate for drift using predicted beam drift for each beam coordinate calculated using the drift model.

9. The method of claim 8 in which adjusting the processing beam coordinates to compensate for drift using a predicted beam drift includes adjusting the processing beam coordinates to compensate for drift using a predicted beam drift determined by modeling the drift rate as an exponentially decreasing function of time.

10. The method of claim 9, wherein modeling the drift rate as an exponentially decreasing function of time includes coefficients determined from measurements of the observed position of the fiducial taken at two or more different observation times.

11. The method of claim 8 in which the imaging beam and the processing beam are generated by the same focused ion beam column.

12. The method of claim 8 in which the imaging beam comprises an electron beam and in which the processing beam comprises a focused ion beam.

13. The method of claim 8 in which directing a processing beam toward a sample for charged particle beam processing includes directing a focused ion beam toward a sample to etch the sample, to deposit material on the sample or to image the sample.

14. The method of claim 8 in which directing a processing beam toward a sample for charged particle beam processing includes directing a focused ion beam toward a photolithography mask, a microelectromechanical assembly, a biological sample, an integrated circuit, a magnetic disk drive read head, or an electrooptical device.

15. A system for processing a feature in a sample, said sample showing a fiducial in close proximity to the feature to be processed so that a stage does not have to be moved between a step of imaging the fiducial and a step of processing the feature, the system comprising:

a first beam to image the fiducial to determine the position of the fiducial on the sample relative to a beam coordinate system of the first beam;

a second beam to process the feature, wherein the first and second beams are provided from one or more sources; and a non-transitory computer memory storing beam drift information for determining a drift model for the beam system from repeated measurements of a reference mark over a period of time to determine an offset between the beam controller coordinate system and the location of the reference mark, and for continuously altering the beam coordinates of the second beam to compensate for predicted beam drift at each beam coordinate by using the offset between the beam coordinate system of the first beam and the position of the fiducial, said offset determined from the drift model.

16. The system of claim 15 in which the computer memory storing beam drift information includes a computer memory storing an algorithm determined from empirical drift information measured by observing the coordinate drift over time.

17. The system of claim 16, wherein calculating a predicted drift comprises determining an amount of drift from an expression comprising an exponential.

18. The system in claim 15, the system equipped with means for forming the fiducial.

19. A method of extracting a TEM sample from a substrate, the method comprising:
    milling a fiducial in close proximity to the location of a sample to be extracted, the fiducial being sufficiently close to the sample to be extracted so that a stage holding the sample need not be moved between a step of imaging the fiducial and a step of extracting the sample;
    directing a cutting beam to make one or more coarse cuts into the sample;
    imaging the fiducial to determine from the position of the first fiducial an offset to apply to the beam position coordinate;
    determining a drift model reflecting predicted beam drift over time; and
    directing a cutting beam to make one or more fine cuts into the sample;
    wherein the beam position is continuously adjusted during at least one of the cutting steps to compensate for predicted beam drift in accordance with the previously determined drift model.

20. The method of claim 19 in which imaging the fiducial includes imaging the fiducial using an electron beam and in which directing a cutting beam to make one or more coarse cuts includes directing a focused ion beam to make one or more coarse cuts.

21. The method of claim 19 in which imaging the fiducial includes imaging the fiducial using a focused ion beam and in which directing a cutting beam to make one or more coarse cuts includes directing the focused ion beam to make one or more coarse cuts.

22. The method of claim 19, wherein the imaging beam is an electron beam and the cutting beam is an ion beam.

23. A method of processing a microscopic structure on a sample using a beam, the beam tending to change position over time due to instabilities in positioning the beam relative to the sample, comprising:
    determining a beam path for processing the structure;
    directing along the beam path on the sample to a series of beam coordinates along the determined beam path; and
    without moving the beam to image a reference mark, adjusting the position of the beam in accordance with a drift prediction by applying an offset to each beam coordinate to cause the beam to more closely approximate the determined beam path.

24. The method of claim 23 in which adjusting the position of the beam in accordance with a drift prediction occurs when the beam is directed toward the sample.

25. The method of claim 23 further comprising directing a second beam toward a reference mark to determine a beam coordinate offset.

26. A method of imaging a feature in a sample, the method comprising:
    locating a fiducial in close proximity to the location of the feature to be imaged so that a stage holding the sample need not be moved between a fiducial-imaging step and a feature-imaging step;
    imaging the fiducial with a first imaging beam to determine the position of the fiducial to use as an alignment marker for fine imaging;
    determining from the position of the fiducial an offset to direct a second imaging beam to make an image of the feature;
    while imaging the feature, calculating a predicted drift and corresponding updated offset value to position the second imaging beam, and correcting the second imaging beam position according to the updated offset value; and
    at least once during image creation, re-imaging the fiducial with the first imaging beam in order to determine from its position an offset to direct the second imaging beam to continue the image creation and to more accurately predict drift during the image creation.

27. The method of claim 26, wherein the first imaging beam and the second imaging beam are the same beam.

28. The method of claim 26, wherein calculating a predicted drift comprises determining an amount of drift over time from an empirically-determined curve.

29. The method of claim 28, wherein the empirically-determined curve is a function of an exponential.

30. The method of claim 29, wherein the coefficients of the exponential are determined from measurements of the position of the fiducial taken at two or more different times.

31. The method of claim 29, wherein a constant factor in the exponent of the exponential is determined empirically.

32. The method of claim 29, wherein a constant factor in the exponent of the exponentially-determined curve is determined from measurements of the position of the fiducial taken at two or more different times.

* * * * *